(12) United States Patent
Min et al.

(10) Patent No.: US 7,545,701 B2
(45) Date of Patent: Jun. 9, 2009

(54) CIRCUIT AND METHOD OF DRIVING SUB-WORD LINES OF A SEMICONDUCTOR MEMORY DEVICE

(75) Inventors: Young-Sun Min, Seoul (KR); Jong-Hyun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 11/634,428

(22) Filed: Dec. 6, 2006

(65) Prior Publication Data

US 2007/0133318 A1  Jun. 14, 2007

(30) Foreign Application Priority Data

Dec. 13, 2005  (KR) ........................ 10-2005-0122237

(51) Int. Cl.
*G11C 8/00* (2006.01)
*G11C 7/00* (2006.01)

(52) U.S. Cl. ........................... 365/230.03; 365/230.06; 365/203

(58) Field of Classification Search ............ 365/230.03, 365/230.06, 203
See application file for complete search history.

(56) References Cited

U.S. PATENT DOCUMENTS

| | | | | |
|---|---|---|---|---|
| 5,761,135 A | * | 6/1998 | Lee | 365/230.06 |
| 5,835,439 A | * | 11/1998 | Suh | 365/230.06 |
| 5,933,388 A | * | 8/1999 | Choi | 365/230.06 |
| 6,160,753 A | | 12/2000 | Shibayama | |
| 6,201,745 B1 | * | 3/2001 | Ryu et al. | 365/230.06 |
| 6,246,631 B1 | * | 6/2001 | Park | 365/230.06 |
| 6,392,956 B2 | * | 5/2002 | Matsui et al. | 365/230.06 |
| 6,414,887 B2 | * | 7/2002 | Koshikawa | 365/230.06 |
| 6,421,295 B1 | * | 7/2002 | Mao et al. | 365/230.06 |
| 6,424,589 B2 | * | 7/2002 | Mochida | 365/230.06 |
| 6,545,923 B2 | * | 4/2003 | Sim et al. | 365/230.06 |
| 6,614,712 B2 | * | 9/2003 | Uchida et al. | 365/230.06 |
| 6,813,216 B2 | * | 11/2004 | Lee | 365/230.06 |
| 7,206,252 B2 | * | 4/2007 | Kim | 365/230.06 |
| 7,248,535 B2 | * | 7/2007 | Chun | 365/230.06 |
| 7,359,273 B2 | * | 4/2008 | Cho et al. | 365/230.06 |

FOREIGN PATENT DOCUMENTS

| | | |
|---|---|---|
| JP | 20000057767 | 2/2000 |
| KR | 20020033883 | 5/2002 |
| KR | 20040054362 | 6/2004 |

* cited by examiner

*Primary Examiner*—Trong Phan
(74) *Attorney, Agent, or Firm*—Mills & Onello, LLP

(57) ABSTRACT

A circuit and method of driving a sub-word line of a semiconductor memory device capable of reducing power consumption is disclosed. The sub-word line driving circuit includes a first transistor, a second transistor and a third transistor. The first transistor pre-charges a boost node to a first voltage in response to a main word line driving signal. The second transistor boosts the boost node to a second voltage in response to a sub-word line driving signal, and provides the sub-word line driving signal to a sub-word line. The third transistor provides the main word line driving signal to the sub-word line in response to a third voltage that has a lower level than a logic "high" state of the sub-word line driving signal.

9 Claims, 5 Drawing Sheets

200

CIRCUIT AND METHOD OF DRIVING SUB-WORD LINES OF A SEMICONDUCTOR MEMORY DEVICE

CROSS-REFERENCE TO RELATED APPLICATIONS

This application claims priority under 35 U.S.C. § 119 to Korean Patent Application No. 10-2005-0122237 filed on Dec. 13, 2005, in the Korean Intellectual Property Office, the contents of which are herein incorporated by reference in its entirety.

BACKGROUND OF THE INVENTION

1. Field of the Invention

The present invention relates to a semiconductor memory device, more particularly to a circuit and a method of driving sub-word lines of a semiconductor memory device.

2. Description of the Related Art

FIG. 1 is a circuit diagram illustrating a conventional sub-word line driving circuit of a semiconductor memory device, and is disclosed in a Korean Patent Laid-Open Publication No. 2004-54362.

Referring to FIG. 1, the sub-word line driving circuit drives a word line WL in response to control signals NWE, PXID, PXIDG and PXIB, and includes NMOS transistors MN1, MN2, MN3 and MN4. The main word line driving signal NWE is a signal driving a main word line that is included in the semiconductor memory device, and the sub-word line driving signal PXID is a signal driving a word line WL that is coupled to the main word line. The control signal PXIDG is a signal that is applied to a gate of the NMOS transistor MN3, and the control signal PXIB is an inverted signal of the sub-word line driving signal PXID. The control signal PXIB is applied to a gate of the NMOS transistor MN4, which has its drain coupled to the source of transistor MN2 and its source coupled to ground voltage supply VSS. The main word line driving signal NWE and the sub-word line driving signal PXID change from 0V to a boosted voltage VPP.

The sub-word line driving circuit operates as follows. When the main word line driving signal NWE is enabled, a boost node NB is charged to a voltage VPP-Vth. Then, when the sub-word line driving signal PXID is enabled, the boost node NB is charged to a voltage 2VPP-Vth by an overlap capacitance existing between a gate and a drain of the NMOS transistor MN2. Here, Vth denotes a threshold voltage of the NMOS transistor MN1. Therefore, the boosted voltage VPP is supplied to the word line WL through the NMOS transistor MN2. The NMOS transistor MN3 mainly serves to maintain the word line WL in logic "low" state when the main word line driving signal NWE is in logic "low" state and the sub-word line driving signal PXID is in logic "high" state.

FIG. 2 is a circuit diagram illustrating another conventional sub-word line driving circuit of a semiconductor memory device, and is disclosed in a Korean Patent Laid-Open Publication No. 2002-33883.

Referring to FIG. 2, an NMOS transistor MN3, the gate of which is connected to the drain of an NMOS transistor MN2, mainly serves to maintain a word line WL in logic "low" state when a main word line driving signal NWE is in logic "low" state and a sub-word line driving signal PXID is in logic "high" state.

When the main word line driving signal NWE is in logic "low" state and the sub-word line driving signal PXID is in logic "high" state, the voltage that should be applied to the gate of the NMOS transistor MN3 so as to turn on the NMOS transistor MN3 is lower than VPP. However, in the sub-word line driving circuit in FIG. 2, the sub-word line driving signal PXID, having a value of VPP, is applied to the gate of the NMOS transistor MN3.

FIG. 3 is a circuit diagram illustrating still another conventional sub-word line driving circuit of a semiconductor memory device, and is disclosed in a Korean Patent Laid-Open Publication No. 2002-33883. Referring to FIG. 3, VPP-Vth is applied to the gate of the NMOS transistor MN3 through an NMOS transistor MN5. In the sub-word line driving circuit having the structure in FIG. 3, the gate voltage that turns on the NMOS transistor MN3 so as to maintain a word line WL in logic "low" state is VPP-Vth when a main word line driving signal NWE is in logic "low" state and a sub-word line driving signal PXID is in logic "high" state. Accordingly, the sub-word line driving circuit shown in FIG. 3 consumes less VPP power than the circuit in FIG. 2.

SUMMARY OF THE INVENTION

In accordance with aspects of the present invention, provided can be a sub-word line driving circuit capable of reducing power consumption.

In accordance with aspects of the present invention, provided can be a semiconductor memory device having the sub-word line driving circuit capable of reducing the power consumption.

In accordance with aspects of the present invention, also provided can be a method of driving a word line, which is capable of reducing the power consumption.

In accordance with one aspect of the present invention, there is provided a sub-word line driving circuit including a first transistor, a second transistor and a third transistor. The first transistor is configured to pre-charge a boost node to a first voltage in response to a main word line driving signal. The second transistor is configured to boost the boost node to a second voltage in response to a sub-word line driving signal, and provides the sub-word line driving signal to a word line. The third transistor is configured to provide the main word line driving signal to the word line in response to a third voltage that has a lower level than a logic "high" state of the sub-word line driving signal.

The third transistor can maintain a voltage of the word line in logic "low" state when the main word line driving signal is in logic "low" state and the sub-word line driving signal is in logic "high" state.

The sub-word line driving circuit can further include a fourth transistor configured to pull down the word line when the sub-word line driving signal is disabled.

The sub-word line driving circuit can further include a control signal generating circuit configured to generate the third voltage when the sub-word line driving signal is enabled.

The control signal generating circuit can include a fifth transistor and a sixth transistor. The fifth transistor can have a control terminal to which the sub-word line driving signal is applied, a first terminal to which a first supply voltage having a lower level than a logic "high" state of the sub-word line driving signal is applied, and a second terminal coupled to the third transistor. The sixth transistor can have a first terminal coupled to the second output terminal of the fifth transistor, and can be coupled to the fourth transistor in a current mirror configuration.

The first supply voltage can be supplied to a memory cell array included in a semiconductor memory device.

In accordance with another aspect of the present invention, there is provided a sub-word line driving circuit including a plurality of sub-word line drivers and a control signal generating circuit. The plurality of sub-word line drivers includes a first transistor and a second transistor. The first transistor is configured to maintain a voltage of a word line in a logic "low" state when a main word line driving signal is in a logic "low" state and a sub-word line driving signal is in a logic "high" state.

The second transistor is configured to pull down the word line when the sub-word line driving signal is in a logic "low" state. The control signal generating circuit is configured to generate a control voltage having a lower level than the logic "high" state of the sub-word line driving signal when the sub-word line driving signal is enabled, and to supply the control voltage to the first transistor included in each of the sub-word line drivers.

The control signal generating circuit can comprise a third transistor having a control terminal to which the sub-word line driving signal is applied, a first terminal to which a first supply voltage having a lower level than the logic "high" state of the sub-word line driving signal is applied, and a second terminal coupled to the first transistor, and a fourth transistor having a first terminal coupled to the second terminal of the third transistor and being coupled to the second transistor in a current mirror configuration.

The first supply voltage can be supplied to a memory cell array included in a semiconductor memory device.

In accordance with another aspect of the present invention, there is provided a semiconductor memory device including a row decoder, a block selection signal, a main word line driving signal, a sub-word line driving signal and a sub-word line driving circuit.

The row decoder is configured to decode a plurality of row addresses to generate a plurality of decoded row addresses. The block selecting signal generating circuit is configured to generate a memory block selecting signal based on the decoded row addresses. The main word line driving signal generating circuit is configured to generate a main word line driving signal based on the decoded row addresses. The sub-word line driving signal generating circuit is configured to generate a sub-word line driving signal based on the decoded row addresses. The sub-word line driving circuit s configured to perform a self-boosting and to drive a plurality of word lines based on the memory block selecting signal, the main word line driving signal and the sub-word line driving signal. The sub-word line driving circuit can comprise a plurality of sub-word line drivers for driving each of the plurality of word lines. Each of the sub-word line drivers can include a first transistor, a second transistor and a third transistor. The first transistor is configured to pre-charge a boost node to a first voltage in response to the main word line driving signal. The second transistor is configured to boost the boost node to a second voltage in response to the sub-word line driving signal and to provide the sub-word line driving signal to the respective word lines. The third transistor is configured to provide the main word line driving signal to the respective word lines in response to a third voltage that has a lower level than a logic "high" state of the sub-word line driving signal.

The third transistor can be configured to maintain each voltage of the word lines in logic "low" state when the main word line driving signal is in logic "low" state and the sub-word line driving signal is in logic "high" state.

Each of the sub-word line driver can further comprise a fourth transistor configured to pull down the respective word lines when the sub-word line driving signal is disabled.

Each of the sub-word line driver can further comprise a control signal generating circuit configured to generate the third voltage when the sub-word line driving signal is enabled.

In accordance with another aspect of the present invention, there is provided a method of driving a word line including pre-charging a boost node to a first voltage in response to a main word line driving signal; boosting the boost node to a second voltage in response to a sub-word line driving signal for providing the sub-word line driving signal to a word line; and providing the main word line driving signal to the word line in response to a third voltage that has a lower level than a logic "high" state of the sub-word line driving signal.

Providing of the main word line driving signal to the word line can comprise maintaining a voltage of the word line in logic "low" state when the main word line driving signal is in logic "low" state and the sub-word line driving signal is in logic "high" state.

The method can further comprise pulling down the word line when the sub-word line driving signal is disabled.

In the method, the third voltage can be generated when the sub-word line driving signal is enabled.

As a result, a semiconductor memory device having a sub-word line driving circuit according to the present invention can reduce a consumption of VPP power.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Detailed illustrative example embodiments of the present invention are disclosed herein. However, specific structural and functional details disclosed herein are merely representative for purposes of describing example embodiments of the present invention. This invention can be embodied in many alternate forms and should not be construed as limited to the example embodiments set forth herein.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Figure 1:
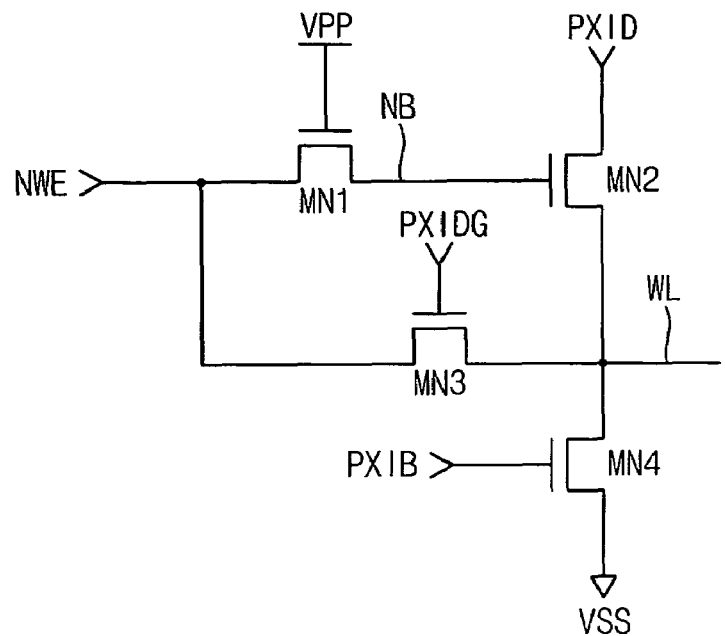
FIG. 1 is a circuit diagram illustrating a conventional sub-word line driving circuit of a semiconductor memory device.
Figure 2:
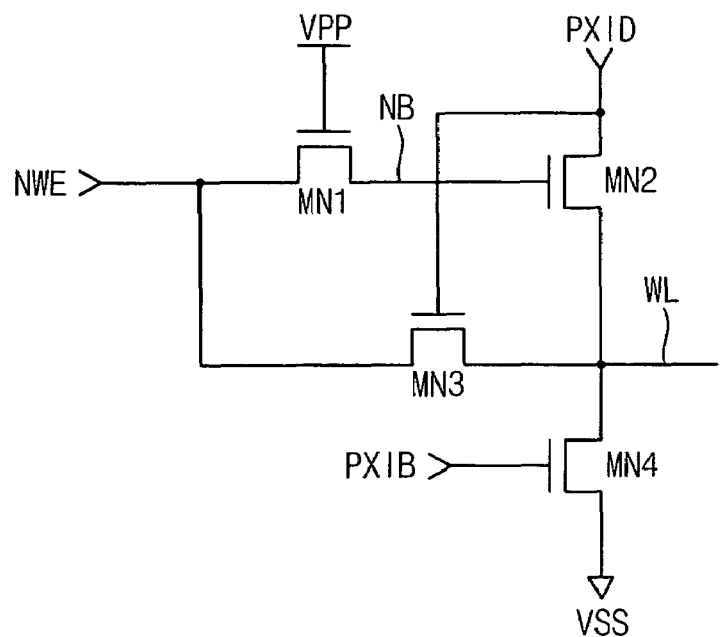
FIG. 2 is a circuit diagram illustrating another conventional sub-word line driving circuit of a semiconductor memory device.
Figure 3:
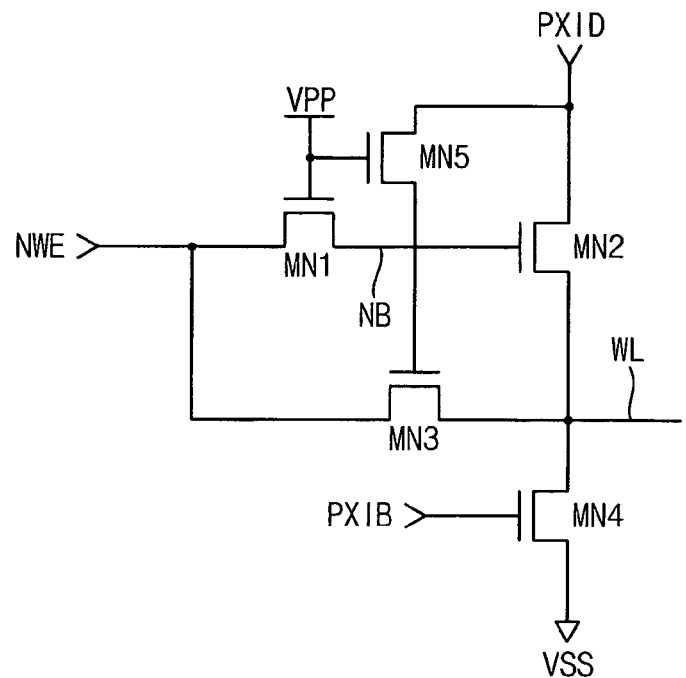
FIG. 3 is a circuit diagram illustrating still another conventional sub-word line driving circuit of a semiconductor memory device.
Figure 4:
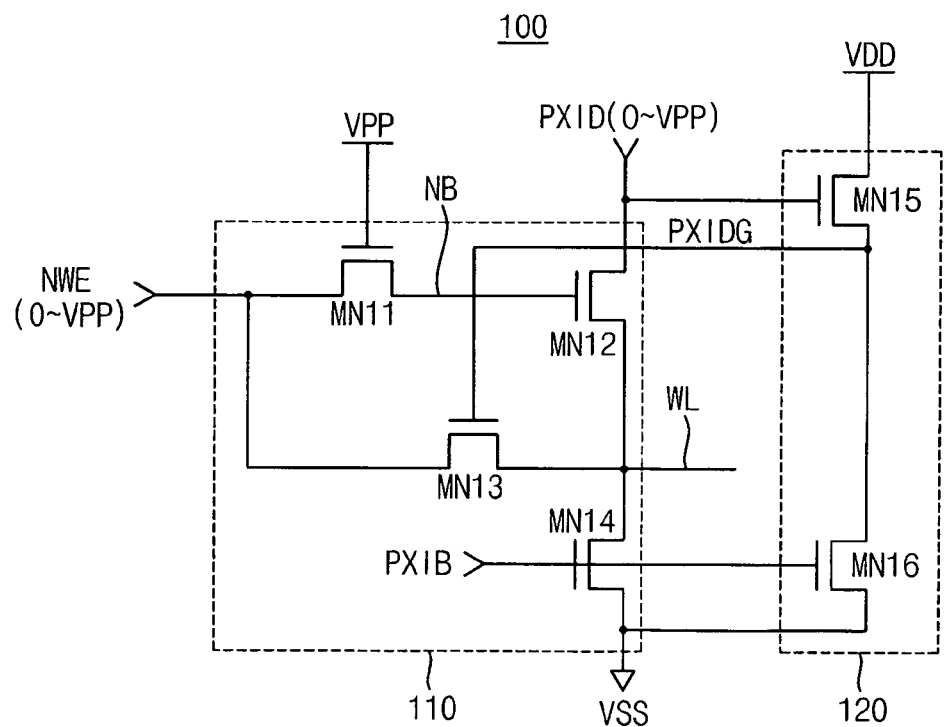
FIG. 4 is a block diagram illustrating example embodiment of a sub-word line driving circuit of a semiconductor memory device according to an aspect of the present invention.

FIG. 4 is a block diagram illustrating a sub-word line driving circuit of a semiconductor memory device according to an example embodiment of the present invention. Referring to FIG. 4, the sub-word line driving circuit includes a sub-word line driving unit 110 and a control signal generating circuit 120. The sub-word line driving unit 110 includes NMOS transistors MN11 through MN14.

The NMOS transistor MN11 pre-charges a boost node NB to a first voltage (VPP-Vth) in response to a main word line driving signal NWE. The NMOS transistor MN12 boosts the boost node NB to a second voltage (2VPP-Vth) in response to a sub-word line driving signal PXID, and provides the sub-word line driving signal PXID to a word line WL. The NMOS transistor MN13 provides the main word line driving signal NWE to the word line WL in response to a third voltage PXIDG that has lower level than a logic "high" state of the sub-word line driving signal PXID. The NMOS transistor MN14 pulls down the word line WL when the sub-word line driving signal PXID is disabled.

The control signal generating circuit 120 generates the third voltage PXIDG when the sub-word line driving signal PXID is enabled. The control signal generating circuit 120 includes NMOS transistors MN15 and MN16.

The NMOS transistor MN15 has a gate to which the sub-word line driving signal PXID is applied, a drain to which a first supply voltage VDD having a lower level than a logic "high" state (VPP) of the sub-word line driving signal PXID is applied, and a source coupled to a gate of the NMOS transistor MN13. The NMOS transistor MN16 has A drain coupled to the source of the NMOS transistor MN15, and a gate to which a control signal PXIB is applied to in common with the NMOS transistor MN14.

Hereinafter, the operation of the sub-word line driving circuit 100 shown in FIG. 4 according to an example embodiment of the present invention will be described.

The main word line driving signal NWE and the sub-word line driving signal PXID vary between 0V and the boosted voltage (VPP), indicated as ( 0~VPP). In general, the sub-word line driving signal PXID is enabled in a predetermined time after the main word line driving signal NWE is enabled. The boosted voltage (VPP) is applied to a gate of the NMOS transistor MN11. The NMOS transistor MN11 pre-charges the boost node NB to the first voltage (VPP-Vth) when the main word line driving signal NWE has a value of the VPP. The boost node NB is boosted by a capacitance (not drawn) existing between a gate and a drain of the NMOS transistor MN12. The NMOS transistor MN12 boosts up the boost node NB when the sub-word line driving signal PXID has a value of the VPP. Then the voltage of the boost node NB becomes equal to the first voltage (VPP-Vth) plus the VPP that is a value of the sub-word line driving signal PXID. The NMOS transistor MN12 provides the sub-word line driving signal PXID which has a value of VPP to the word line WL.

The NMOS transistor MN13 mostly maintains a voltage of the word line WL in logic "low" state when the main word line driving signal NWE is in logic "low" state (0) and the sub-word line driving signal PXID is in logic "high" state (VPP). The NMOS transistor MN13 is turned on based on the third voltage PXIDG which has lower level than a logic "high" state (VPP) of the sub-word line driving signal PXID, and supplies the main word line driving signal NWE to the word line WL. The voltage of the word line WL becomes logic "low" state (0) when the main word line driving signal NWE is in logic "low" state (0).

The control signal PXIB is a signal that has a phase opposite from a phase of the sub-word line driving signal PXID. The NMOS transistor MN14, which is coupled between the word line WL and ground voltage VSS, pulls down the word line WL when the sub-word line driving signal PXID is disabled.

The third voltage PXIDG applied to the gate of the NMOS transistor MN13 is generated by the control signal generating circuit 120. The control signal generating circuit 120 enables the third voltage PXIDG when the sub-word line driving signal PXID is enabled.

When the sub-word line driving signal PXID is enabled, the VPP is applied to the gate of the NMOS transistor MN15. Therefore, the voltage of the source of the NMOS transistor MN15, that is the voltage of the gate of the NMOS transistor MN13, has a value similar to the voltage (VDD) applied to the drain of the NMOS transistor MN15. The NMOS transistor MN16 maintains the voltage of the gate of the NMOS transistor MN13 in logic "low" state when the sub-word line driving signal PXID is enabled.

Figure 5:
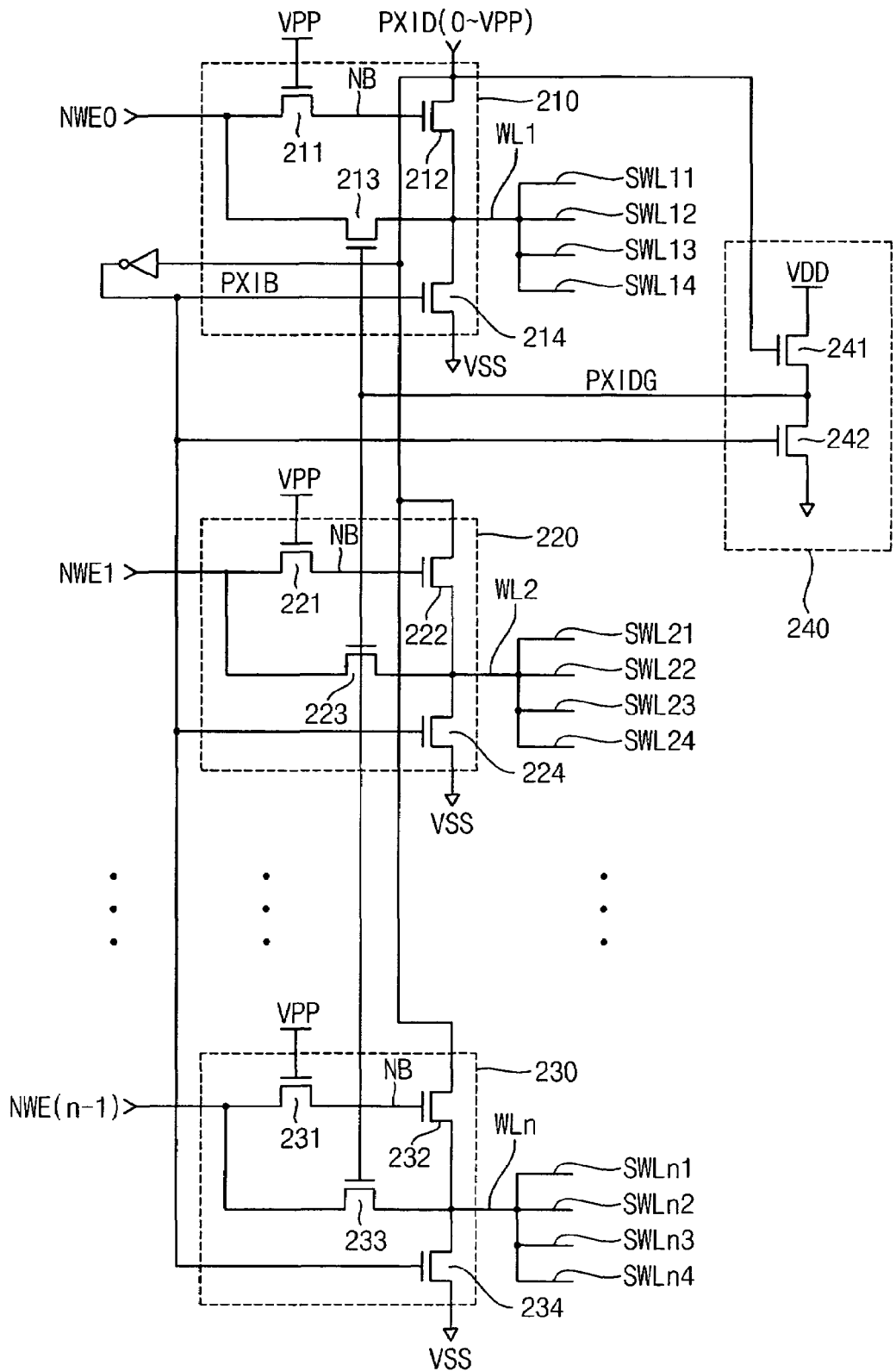
FIG. 5 is a block diagram illustrating an example embodiment of a sub-word line driving circuit of a semiconductor memory device according to another aspect of the present invention.

FIG. 5 is a block diagram illustrating a sub-word line driving circuit of a semiconductor memory device according to another example embodiment of the present invention. Referring to FIG. 5, the sub-word line driving circuit 200 includes sub-word line drivers 210, 220 and 230, and a control signal generating circuit 240.

The sub-word line driver 210 includes NMOS transistors 211 through 214. The NMOS transistors 213 maintain a voltage of a word line WL1 in logic "low" state when a main word line driving signal NWE0 is in logic "low" state and a sub-word line driving signal PXID is in logic "high" state. The NMOS transistors 214 pulls down the word line WL1 when the sub-word line driving signal PXID is in logic "low" state. The NMOS transistors 211 pre-charges a boost node NB to a first voltage (VPP-Vth) in response to the main word line driving signal NWE0. The NMOS transistor 212 boosts the boost node NB to a second voltage (2VPP-Vth) in response to the sub-word line driving signal PXID, and provides the sub-word line driving signal PXID to the word line WL1. The word line WL1 is coupled to the sub-word lines SWL11 through SWL14.

The word line driver 220 includes NMOS transistors 221 through 224. The NMOS transistors 223 maintains a voltage of a word line WL2 in logic "low" state when a main word line driving signal NWE1 is in logic "low" state and the sub-word line driving signal PXID is in logic "high" state. The NMOS transistors 224 pulls down the word line WL2 when the sub-word line driving signal PXID is in logic "low" state. The NMOS transistors 221 pre-charges a boost node NB to a first voltage (VPP-Vth) in response to the main word line driving signal NWE1. The NMOS transistor 222 boosts the boost node NB to a second voltage (2VPP-Vth) in response to the sub-word line driving signal PXID, and provides the sub-word line driving signal PXID to the word line WL2. The word line WL2 is coupled to the sub-word lines SWL21 through SWL24.

The sub-word line driver 230 includes NMOS transistors 231 through 234. The NMOS transistors 233 maintains a voltage of a word line WLn in logic "low" state when a main word line driving signal NWE(n−1) is in logic "low" state and the sub-word line driving signal PXID is in logic "high" state. The NMOS transistors 234 pulls down the word line WLn when the sub-word line driving signal PXID is in logic "low" state. The NMOS transistors 231 pre-charges a boost node NB to a first voltage (VPP-Vth) in response to the main word line driving signal NWE(n−1). The NMOS transistor 232 boosts the boost node NB to a second voltage (2VPP-Vth) in response to the sub-word line driving signal PXID, and provides the sub-word line driving signal PXID to the word line WLn. The word line WLn is coupled to the sub-word lines SWLn1 through SWLn4.

The control signal generating circuit 240 generates a third voltage PXIDG which is a control voltage having a level lower than a logic "high" state (VPP) of the sub-word line driving signal PXID when the sub-word line driving signal PXID is enabled, and provides the third voltage PXIDG to the respective gates of the NMOS transistors 213, 223 and 233 respectively included in the sub-word line drivers 210, 220 and 230. The control signal generating circuit 240 includes NMOS transistors 241 and 242.

Figure 6:
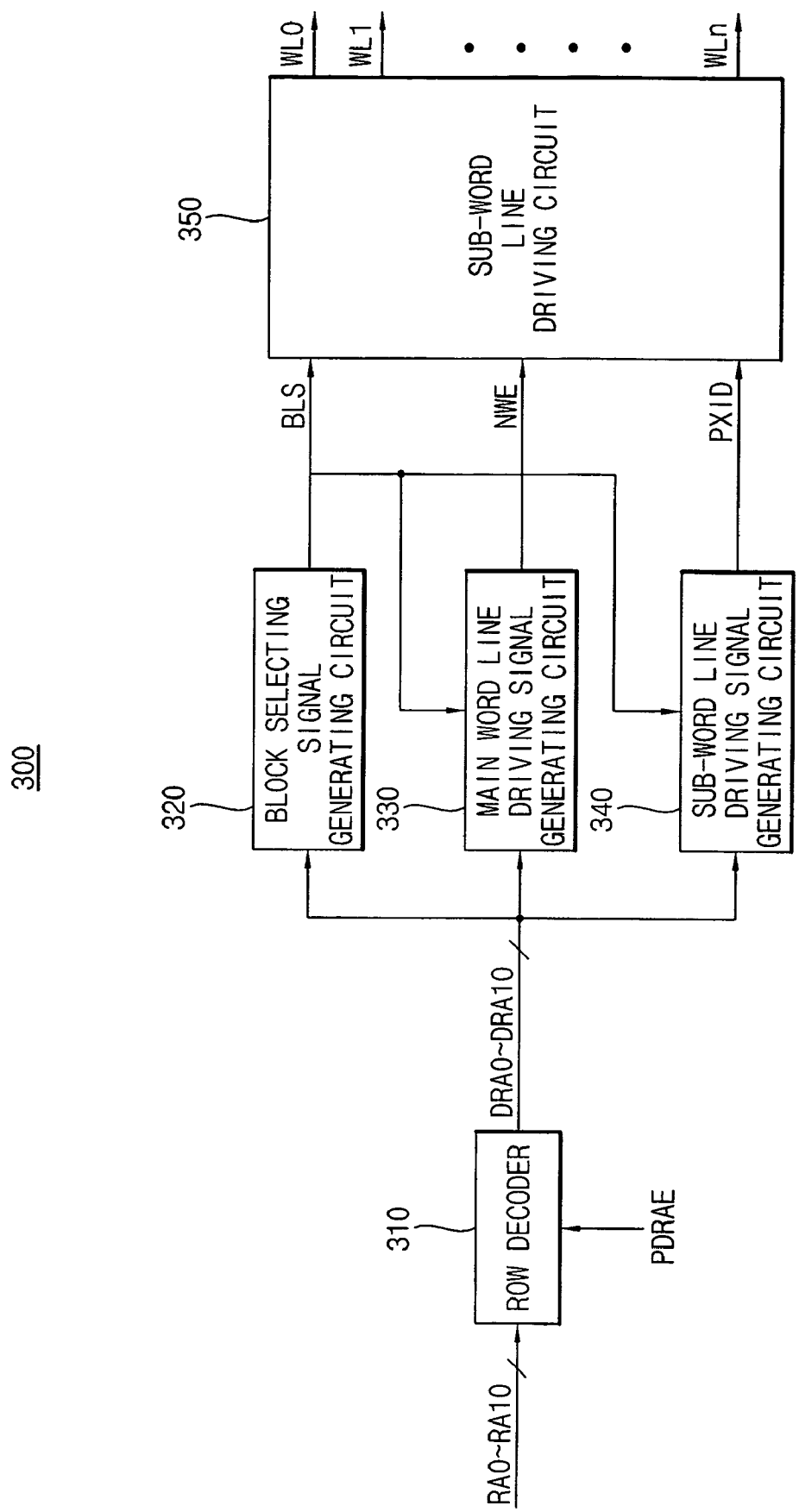
FIG. 6 is a block diagram illustrating an example embodiment of a semiconductor memory device including a sub-word line driving circuit according to aspects of the present invention.

FIG. 6 is a block diagram illustrating a semiconductor memory device including a sub-word line driving circuit according to example embodiments of the present invention.

Referring to FIG. 6, the semiconductor memory device 300 includes a row decoder 310, a block selecting signal generating circuit 320, a main word line driving signal generating circuit 330, a sub-word line driving signal generating circuit 340 and a sub-word line driving circuit 350.

The row decoder 310 decodes a plurality of row addresses RA0 through RA10 to generate a plurality of decoded row addresses DRA0 through DRA10 in response to an enable signal PDRAE. The block selecting signal generating circuit 320 generates a memory block selecting signal BLS based on the decoded row addresses DRA0 through DRA10. The main word line driving signal generating circuit 330 generates a main word line driving signal NWE based on the decoded row addresses DRA0 through DRA10. The sub-word line driving signal generating circuit 340 generates a sub-word line driving signal PXID based on the decoded row addresses DRA0 through DRA10. The sub-word line driving circuit 350 performs a self-boosting and drives sub-word lines WL0 through WLn based on the memory block selecting signal BLS, the main word line driving signal NWE and the sub-word line driving signal PXID.

The sub-word line driving circuit 350 included in the semiconductor memory device 300 as shown in FIG. 6 includes a plurality of sub-word line driving circuits having the structure of the sub-word line driving circuit 100 in FIG. 4.

According to the sub-word line driving circuit 100 in FIG. 4, the supply voltage VDD which is lower than the boosted voltage VPP, is applied to the gate of the NMOS transistor MN13 in order to maintain a voltage of the sub-word line WL in logic "low" state, when the main word line driving signal NWE is in logic "low" state and the sub-word line driving signal PXID is in logic "high" state. Accordingly, the semiconductor memory device 300 in FIG. 6 having the sub-word line driving circuit 350 that has substantially the same structure as that of the sub-word line driving circuit 100 in FIG. 4, can reduce a power consumption of VPP power.

Figure 7:
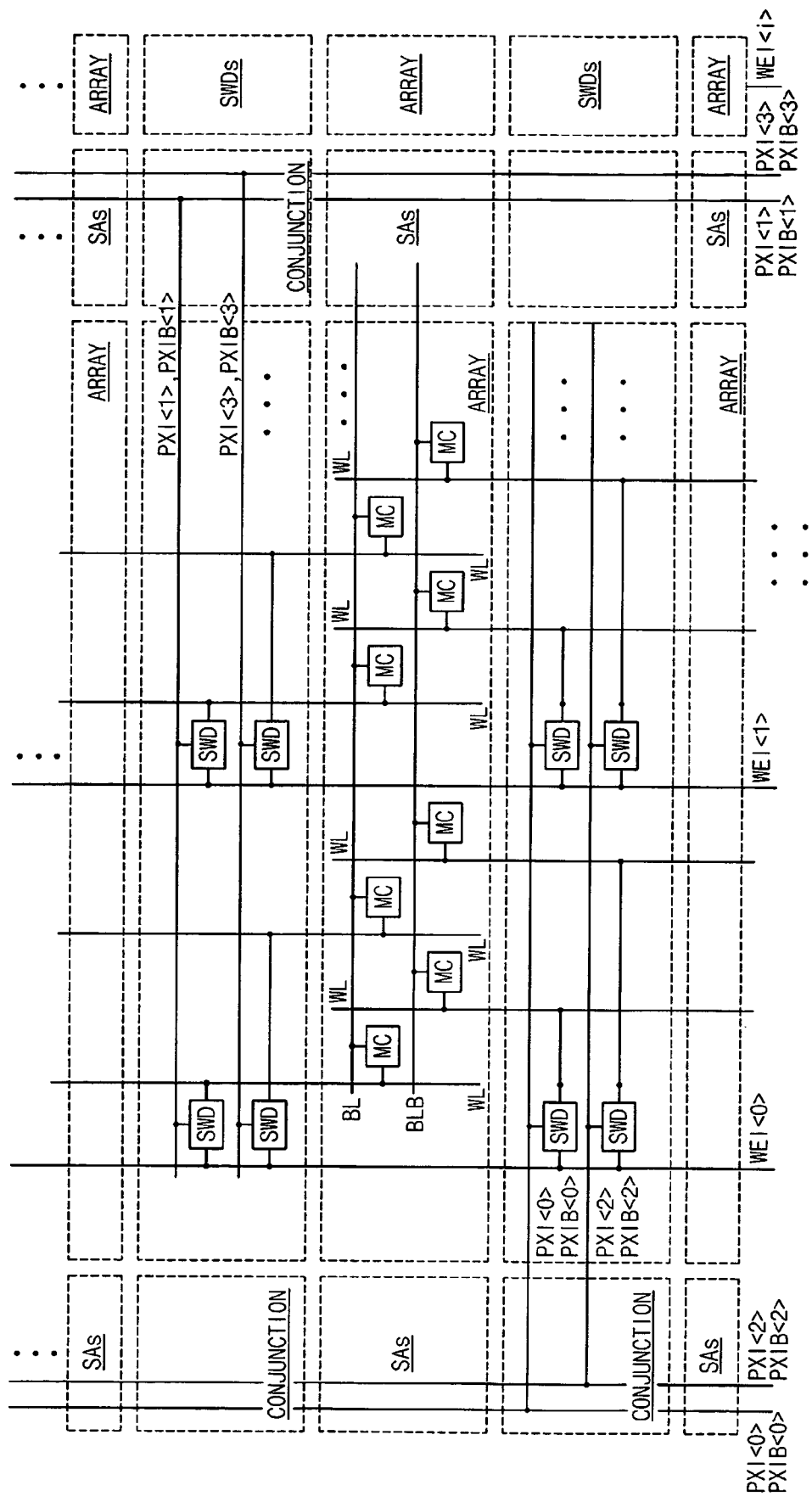
FIG. 7 is a layout diagram of an example embodiment of a semiconductor memory device including a sub-word line driving circuit according to aspects of the present invention.

FIG. 7 is a layout diagram of a semiconductor memory device including a sub-word line driving circuit according to example embodiments of the present invention.

Referring to FIG. 7, the semiconductor memory device includes sense amplifier blocks SAs, memory cell arrays ARRAY, sub-word line driver blocks SWDs and conjunction circuits CONJUNCTION. Each of the memory cell arrays includes a memory cell MC, and a memory cell located at an intersecting point of a word line WL and a bit-line BL/BLB includes a cell transistor and a cell capacitor. The word lines WL are driven by a sub-word line driver SWD located in the sub-word line driver blocks SWDs. The main word line driving signals are indicated as WEI<0>...WEI<i>; the sub-word line driving signals (PXI) signals are indicated as PXI <0>...PXI <3>; and control signals (PXIB) are indicated as PXIB <0>...PXI <3>. Note that PXID in FIG. 4 is merely a delayed PXI and NWE in FIG. 4 is the same as the WEI signals in FIG. 7, as would be understood by those skilled in the art. The sub-word line driver SWD has substantially the same structure as that of the sub-word line driver shown in FIG. 4.

As described above, a supply voltage (VDD) which is lower than a boosted voltage (VPP) is applied to a gate of an NMOS transistor (MN13) in order to maintain a voltage of a sub-word line (WL) in logic "low" state when a main word line driving signal (NWE) is in logic "low" state and a sub-word line driving signal (PXID) is in logic "high" state. Therefore, the semiconductor memory device having the sub-word line driving circuit according to the present invention can reduce the consumption of VPP power.

Having thus described example embodiments of the present invention, it is to be understood that the invention defined by the appended claims is not to be limited by particular details set forth in the above description as many apparent variations thereof are possible without departing from the spirit or scope thereof as hereinafter claimed. It is intended by the following claims to claim that which is literally described and all equivalents thereto, including all modifications and variations that fall within the scope of each claim.

What is claimed is:
1. A sub-word line driving circuit, comprising:
   a first transistor configured to pre-charge a boost node to a first voltage in response to a main word line driving signal;
   a second transistor configured to boost the boost node to a second voltage in response to a sub-word line driving signal, and configured to provide the sub-word line driving signal to word line;
   a third transistor configured to provide the main word line driving signal to the word line in response to a third voltage that has a lower level than a logic "high" state of the sub-word line driving signal;
   a fourth transistor configured to pull down the word line when the sub-word line driving signal is disabled; and
   a control signal generating circuit configured to generate the third voltage when the sub-word line driving signal is enabled, the control signal generating circuit comprising:

a fifth transistor having a control terminal to which the sub-word line driving signal is applied, a first output terminal to which a first supply voltage having a lower level than a logic "high" state of the sub-word line driving signal is applied, and a second output terminal coupled to the third transistor; and a sixth transistor having a control terminal to which a control signal having a phase opposite from a phase of the sub-word line driving signal is applied and a first output terminal coupled to the second output terminal of the fifth transistor.

2. The sub-word line driving circuit of claim 1, wherein the third transistor is configured to maintain a voltage of the sub-word line in logic "low" state when the main word line driving signal is in logic "low" state and the sub-word line driving signal is in logic "high" state.

3. The sub-word line driving circuit of claim 1, wherein the first supply voltage is supplied to a memory cell array included in a semiconductor memory device.

4. A sub-word line driving circuit, comprising:

a plurality of sub-word line drivers including a first transistor configured to maintain a voltage of a word line in a logic "low" state when a main word line driving signal is in a logic "low" state and a sub-word line driving signal is in a logic "high" state, and including a second transistor configured to pull down the word line when the sub-word line driving signal is in a logic "low" state; and a control signal generating circuit configured to generate a control voltage having a lower level than the logic "high" state of the sub-word line driving signal when the sub-word line driving signal is enabled, and configured to supply the control voltage to the first transistor included in each of the sub-word line drivers the control signal generating circuit comprising:

a third transistor having a control terminal to which the sub-word line driving signal is applied, a first output terminal to which a first supply voltage having a lower level than the logic "high" state of the sub-word line driving signal is applied, and a second output terminal coupled to the first transistor; and a fourth transistor having a control terminal to which a control signal having a phase opposite from a phase of the sub-word line driving signal is applied and a first output terminal coupled to the second output terminal of the third transistor.

5. The sub-word line driving circuit of claim 4, wherein the first supply voltage is supplied to a memory cell array included in a semiconductor memory device.

6. A semiconductor memory device, comprising:

a row decoder configured to decode a plurality of row addresses to generate a plurality of decoded row addresses;

a block selecting signal generating circuit configured to generate a memory block selecting signal based on the decoded row addresses;

a main word line driving signal generating circuit configured to generate a main word line driving signal based on the decoded row addresses;

a sub-word line driving signal generating circuit configured to generate a sub-word line driving signal based on the decoded row addresses; and a sub-word line driving circuit configured to perform a self-boosting and drive a plurality of word lines, based on the memory block selecting signal, the main word line driving signal and the sub-word line driving signal, wherein the sub-word line driving circuit comprises a plurality of sub-word line drivers for driving each of the plurality of word lines, the each of the plurality of sub-word line drivers comprising;

a first transistor configured to pre-charge a boost node to a first voltage in response to the main word line driving signal;

a second transistor configured to boost the boost node to a second voltage in response to the sub-word line driving signal, and configured to provide the sub-word line driving signal to the respective word lines; and a third transistor configured to provide the main word line driving signal to the respective word lines in response to a third voltage that has a lower level than a logic "high" state of the sub-word line driving signal.

7. The semiconductor memory device of claim 6, wherein the third transistor is configured to maintain each voltage of the sub-word lines in logic "low" state when the main word line driving signal is in logic "low" state and the sub-word line driving signal is in logic "high" state.

8. The semiconductor memory device of claim 6, wherein each of the sub-word line driver further comprises a fourth transistor configured to pull down the respective sub-word lines when the sub-word line driving signal is disabled.

9. The semiconductor memory device of claim 8, wherein each of the sub-word line driver further comprises a control signal generating circuit configured to generate the third voltage when the sub-word line driving signal is enabled.

* * * * *

UNITED STATES PATENT AND TRADEMARK OFFICE
CERTIFICATE OF CORRECTION

| | |
|---|---|
| PATENT NO. | : 7,545,701 B2 |
| APPLICATION NO. | : 11/634428 |
| DATED | : June 9, 2009 |
| INVENTOR(S) | : Young-Sun Min et al. |

It is certified that error appears in the above-identified patent and that said Letters Patent is hereby corrected as shown below:

Column 9, line 16 delete "sub-word" and insert --word--
Column 9, line 37 insert --,-- after "drivers"
Column 10, line 38 delete "sub-word" and insert --word--
Column 10, line 43 delete "sub-word" and insert --word--

Signed and Sealed this

First Day of September, 2009

David J. Kappos
*Director of the United States Patent and Trademark Office*